United States Patent
Ostholt et al.

(10) Patent No.: US 11,478,880 B2
(45) Date of Patent: Oct. 25, 2022

(54) METHOD FOR PRODUCING AT LEAST ONE RECESS IN A MATERIAL BY MEANS OF ELECTROMAGNETIC RADIATION AND SUBSEQUENT ETCHING PROCESS

(71) Applicant: LPKF Laser & Electronics AG, Garbsen (DE)

(72) Inventors: Roman Ostholt, Langenhagen (DE); Norbert Ambrosius, Garbsen (DE); Arne Schnoor, Hannover (DE); Daniel Dunker, Hannover (DE)

(73) Assignee: LPKF LASER & ELECTRONICS AG, Garbsen (DE)

( * ) Notice: Subject to any disclaimer, the term of this patent is extended or adjusted under 35 U.S.C. 154(b) by 536 days.

(21) Appl. No.: 16/490,906

(22) PCT Filed: Mar. 5, 2018

(86) PCT No.: PCT/EP2018/055299
§ 371 (c)(1),
(2) Date: Sep. 4, 2019

(87) PCT Pub. No.: WO2018/162385
PCT Pub. Date: Sep. 13, 2018

(65) Prior Publication Data
US 2020/0009691 A1    Jan. 9, 2020

(30) Foreign Application Priority Data

Mar. 6, 2017  (DE) .................... 10 2017 104 655.0
Mar. 6, 2017  (DE) .................... 10 2017 104 657.7

(51) Int. Cl.
*B23K 26/53*    (2014.01)
*C03C 15/00*    (2006.01)
(Continued)

(52) U.S. Cl.
CPC .......... *B23K 26/53* (2015.10); *B23K 26/0006* (2013.01); *B23K 26/06* (2013.01);
(Continued)

(58) Field of Classification Search
CPC ................ B23K 26/53; B23K 26/0624; B23K 26/0006; B23K 26/06; B23K 26/402;
(Continued)

(56) References Cited

U.S. PATENT DOCUMENTS

| 5,653,901 A * | 8/1997 | Yoshimura | ............. B41J 2/1634 |
| | | | 347/45 |
| 6,362,453 B1 * | 3/2002 | Wang | ................... C03B 33/0207 |
| | | | 219/121.84 |

(Continued)

FOREIGN PATENT DOCUMENTS

| DE | 102010025966 B4 | 3/2012 |
| DE | 102014116958 A1 | 5/2016 |

(Continued)

*Primary Examiner* — Jimmy Chou
*Assistant Examiner* — Yi Hao
(74) *Attorney, Agent, or Firm* — Leydig, Voit & Mayer, Ltd.

(57) ABSTRACT

A method for creating at least one recess, in particular an aperture, in a transparent or transmissive material, includes: selectively modifying the material along a beam axis by electromagnetic radiation; and creating the at least one recess by one or more etching steps, using different etching rates in a modified region and in non-modified regions. The electromagnetic radiation produces modifications having different characteristics in the material along the beam axis such that the etching process in the material is heterogeneous and the etching rates differ from one another in regions modified with different characteristics under unchanged etching conditions.

9 Claims, 3 Drawing Sheets

(51) Int. Cl.
  *B23K 26/00* (2014.01)
  *B23K 26/0622* (2014.01)
  *B23K 26/06* (2014.01)
  *B23K 26/402* (2014.01)
  *B41J 2/14* (2006.01)
  *B41J 2/16* (2006.01)
  *B81B 1/00* (2006.01)
  *B81C 1/00* (2006.01)
  *C03C 23/00* (2006.01)
  *B23K 103/00* (2006.01)

(52) U.S. Cl.
  CPC ........ *B23K 26/0624* (2015.10); *B23K 26/402* (2013.01); *B41J 2/1433* (2013.01); *B41J 2/162* (2013.01); *B41J 2/1626* (2013.01); *B81B 1/004* (2013.01); *B81C 1/00087* (2013.01); *C03C 15/00* (2013.01); *C03C 23/0025* (2013.01); *B23K 2103/50* (2018.08); *B23K 2103/54* (2018.08); *B81B 2201/052* (2013.01); *B81B 2203/0353* (2013.01); *B81C 2201/0143* (2013.01)

(58) Field of Classification Search
  CPC ............. B23K 2103/50; B23K 2103/54; B41J 2/1433; B41J 2/162; B41J 2/1626; B81B 1/004; B81B 2201/052; B81B 2203/0353; B81C 1/00087; B81C 2201/0143; C03C 15/00; C03C 23/0025
  See application file for complete search history.

(56) References Cited

U.S. PATENT DOCUMENTS

| | | | |
|---|---|---|---|
| 9,278,886 B2 * | 3/2016 | Boek | B23K 26/386 |
| 9,517,963 B2 * | 12/2016 | Marjanovic | C03C 15/00 |
| 10,163,623 B1 * | 12/2018 | Kelly | H01L 29/6656 |
| 10,417,670 B1 * | 9/2019 | Sulejmani | G06Q 30/0281 |
| 10,611,667 B2 * | 4/2020 | Bookbinder | B23K 26/53 |
| 10,717,670 B2 * | 7/2020 | Inoue | C03C 3/091 |
| 2003/0235385 A1 * | 12/2003 | Taylor | G02B 6/13 |
| | | | 216/87 |
| 2007/0298529 A1 * | 12/2007 | Maeda | B23K 26/0624 |
| | | | 438/33 |
| 2011/0000897 A1 | 1/2011 | Inoue et al. | |
| 2012/0125893 A1 | 5/2012 | Shimoi et al. | |
| 2013/0126573 A1 * | 5/2013 | Hosseini | B23K 26/0006 |
| | | | 225/2 |
| 2013/0210245 A1 | 8/2013 | Jackl | |
| 2015/0038313 A1 * | 2/2015 | Hosseini | B23K 26/38 |
| | | | 219/121.75 |
| 2016/0059359 A1 * | 3/2016 | Krueger | B23K 26/064 |
| | | | 65/158 |
| 2017/0122867 A1 * | 5/2017 | Fukuyama | G02B 21/0076 |
| 2017/0229318 A1 * | 8/2017 | Tsunetomo | B23K 1/0016 |
| 2017/0256422 A1 | 9/2017 | Ambrosius et al. | |
| 2017/0276951 A1 | 9/2017 | Kumkar et al. | |
| 2017/0295652 A1 * | 10/2017 | Isobe | H01L 21/486 |
| 2017/0358447 A1 * | 12/2017 | Tsunetomo | H01L 23/49827 |
| 2018/0085857 A1 * | 3/2018 | Gupta | B23K 26/08 |
| 2018/0340262 A1 * | 11/2018 | Hiranuma | C23F 1/16 |
| 2019/0248698 A1 * | 8/2019 | Tsunetomo | C03B 33/02 |

FOREIGN PATENT DOCUMENTS

| | | | |
|---|---|---|---|
| JP | 2005190857 A | * | 7/2005 |
| JP | 2005190857 A | | 7/2005 |
| JP | 2008156200 A | * | 7/2008 |
| JP | 2008156200 A | | 7/2008 |
| KR | 20100113628 A | | 10/2010 |
| WO | WO 2005033033 A1 | | 4/2005 |
| WO | WO 2012161317 A1 | | 11/2012 |
| WO | WO 2014161534 A2 | | 10/2014 |
| WO | WO 2016041544 A1 | | 3/2016 |

* cited by examiner

METHOD FOR PRODUCING AT LEAST ONE RECESS IN A MATERIAL BY MEANS OF ELECTROMAGNETIC RADIATION AND SUBSEQUENT ETCHING PROCESS

CROSS-REFERENCE TO PRIOR APPLICATIONS

This application is a U.S. National Phase application under 35 U.S.C. § 371 of International Application No. PCT/EP2018/055299, filed on Mar. 5, 2018, and claims benefit to German Patent Application No. DE 10 2017 104 655.0, filed on Mar. 6, 2017, and German Patent Application No. DE 10 2017 104 657.7, filed on Mar. 6, 2017. The International Application was published in German on Sep. 13, 2018 as WO/2018/162385 under PCT Article 21(2).

FIELD

The invention relates to a method for creating at least one recess, in particular aperture, in a transparent or transmissive, in particular plate-shaped, material, wherein the material is selectively modified along a beam axis by means of electromagnetic radiation, in particular of a laser, and the recess is subsequently created by an etching process, wherein different etching rates occur in a modified and in the non-modified areas.

BACKGROUND

WO 2016/041544 A1 describes a method for creating at least one recess, in particular in form of an aperture, in a plate-shaped workpiece. For this purpose, laser radiation is directed at the surface of the workpiece. The laser radiation exposure time is chosen to be extremely short so that only modification of the workpiece concentrically around a beam axis of the laser beam occurs. In a subsequent method step, due to the action of an etching medium by successive etching, an anisotropic material removal occurs in those areas of the workpiece that previously underwent modification by the laser radiation. This creates a recess in form of an aperture in the workpiece along the cylindrical action zone. In particular, the voids produced in a first step can be successively increased to thus create a recess or aperture. A significant advantage of this method is that the modification zone runs essentially cylindrically coaxially to the beam axis, thus resulting in a constant diameter of the aperture or recess.

DE 10 2010 025 966 B4 describes a method in which, in a first step, focused laser pulses, whose radiation intensity is so high that local, athermal destruction occurs along a channel in the glass, are directed at the glass workpiece.

Furthermore, a method for processing glass by creating filaments is known from US 2013/126573 A1.

Etching methods, such as lithography, for creating structures in glass have also long been known. In this case, a coating is exposed and then opened locally. The substrate is then etched to create the desired structures. The coating serves as an etching resist. However, since etching takes place isotropically in those areas where the resist was opened, it is not possible to create structures with a large aspect ratio.

SUMMARY

In an embodiment, the present invention provides a method for creating at least one recess, in particular an aperture, in a transparent or transmissive material, comprising: selectively modifying the material along a beam axis by electromagnetic radiation; and creating the at least one recess by one or more etching steps, using different etching rates in a modified region and in non-modified regions, wherein the electromagnetic radiation produces modifications having different characteristics in the material along the beam axis such that the etching process in the material is heterogeneous and the etching rates differ from one another in regions modified with different characteristics under unchanged etching conditions.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
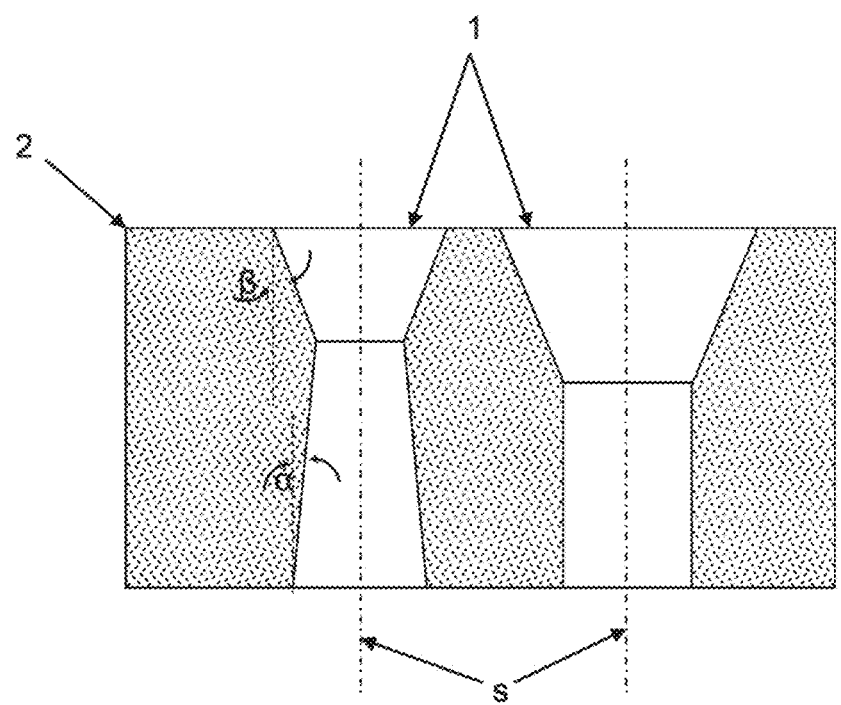
FIG. 1 shows a sectional side view of a glass substrate provided with apertures.

In an embodiment, the present invention provides a possibility of modifying the material by means of electromagnetic radiation in such a way as to realize, in the subsequent etching process, a desired, in particular selectively differing removal of the recesses and thus in particular also recesses with different opening angles.

The invention thus provides a method in which modifications with different characteristics are produced in the material along the beam axis by the electromagnetic radiation, for example by different pulse energy, so that the etching process in the material is heterogeneous, resulting in the etching rate differing in the modified regions under otherwise unchanged etching conditions in the regions modified with different characteristics. According to the invention, this allows the recesses, in particular the apertures, created by the etching treatment in the transparent or transmissive material to be adjusted in a targeted and selective manner by different characteristics of the modifications. For example, the recess is thus enlarged not as a result of longer etching time but due to the faster progression of the etching removal as a function of the different characteristics of the modifications. According to the invention, not only conical enlargements can be created in edge regions close to the surface. Instead, conversely, such enlargements may be countered to produce, for example, cylindrical or convex recesses by adjusting the characteristics of the modifications in the region between the surfaces of the material such that a preferred etching removal occurs there.

It has proven to be particularly promising if the different characteristics of the modifications are achieved by changing the beam shape of the electromagnetic radiation, in particular by means of phase modulation. As a result, the characteristics can be changed in an uninterrupted working step during the processing of the material so that the processing can be carried out largely without unwanted delays.

Moreover, it has also proven to be particularly promising if the different characteristics of the modifications are achieved by varying the process parameters, in particular the focal position, pulse energy, beam shape and/or intensity, so that the variation can be realized with comparatively little process control effort.

Another also particularly expedient embodiment of the invention is also achieved if the cycle of modification and etching treatment of the material is carried out multiple times. Thus, by modifying the material again after a first etching treatment, it is possible, for example, to carry out post-processing with higher accuracy. Especially in combination with an etching process with low etching rates, removal can thus be controlled in a targeted manner and ended once the desired target values have been reached.

In this case, it has proven to be particularly advantageous if several etching steps are carried out in particular under different etching conditions so that an ideal removal rate, on the one hand, and the achievable precision, on the other, are achieved.

Furthermore, it has already proven to be advantageous if a surface of the, in particular, plate-shaped material is covered with an etching resist at least in sections and is thereby protected from the etching attack in the subsequent etching process. As a result, thanks to the one-sided etching attack, it is possible to specifically focus the etching rate on the free surface where increased removal is desired.

Particularly preferably, by selecting the process parameters, the opening angle can be adjusted to, in particular, less than 5° or the diameter of the recess can be adjusted at will, wherein the difference in the opening angles due to the modifications having different characteristics can be more than 10°.

Moreover, recesses can be created such that the diameter and/or the shape of the recesses differ by not more than 3 μm.

Different materials can be used as plate-shaped material which is transparent or transmissive to electromagnetic radiation, wherein the, in particular, plate-shaped material has preferably glass, silicon and/or sapphire as a substantial component, thereby exhibiting excellent physical and chemical resistance which is optimally suitable for various technical applications.

The invention is not limited to specific fields of application. Particularly preferred is an application of the plate-shaped material produced according to the method as a nozzle plate of a printing device.

FIG. 1 shows a sectional side view of a glass substrate 2 provided with an aperture 1 as a material produced according to the method according to the invention. A major advantage of the present invention in the manufacturing process relates to the individual and adjustable variation of the cone angle $\alpha$, $\beta$ of aperture 1 in the glass substrate 2.

As can be seen, a glass substrate 2 is provided with apertures 1 for the first time with the method according to the invention, which apertures 1 in relation to the material's respective outer surfaces have, on the one hand, a small cone angle $\alpha$ of less than 2° and, on the other, a large cone angle $\beta$ of about 20° on the opposite side.

For this purpose, a 100 μm thick glass as glass substrate 2 is, for example, modified with the radiation of a laser system in a first step. Depending on the power introduced into the glass, various modifications of the glass substrate 2 can be adjusted.

Figure 2:
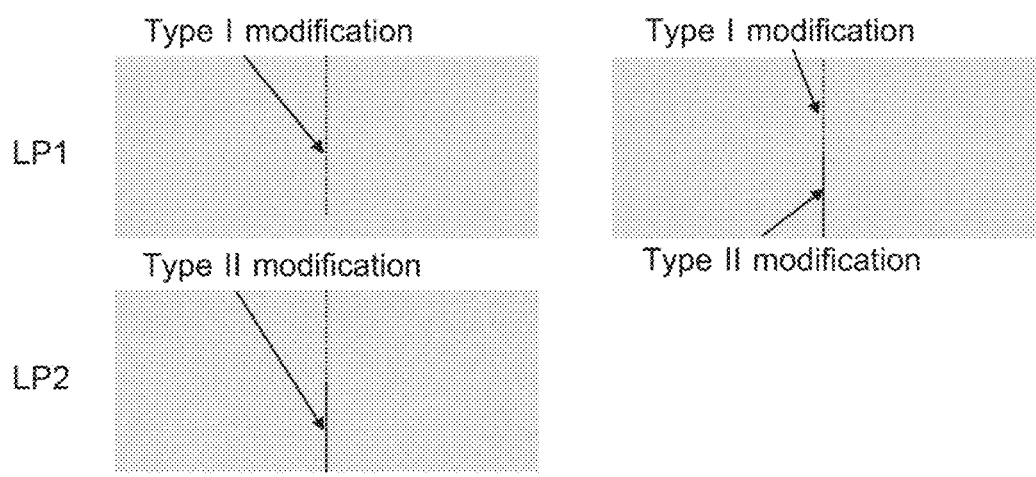
FIG. 2 shows different types of modification.

Hereinafter, the various modifications shown in FIG. 2 are referred to as "type I" or "type II." Here, a "type I" modification is to represent a smaller change in the glass which is also produced by lower laser power. "Type II" modifications are accordingly strong changes in the glass structure and are caused by higher laser power.

Thanks to the very high positioning accuracy of the system, it is possible to very precisely define both the focal length of the laser drawn out by optical aids and the focal length position in the glass substrate 2.

Basically, the "type I" and "type II" modifications in the variants shown on the left side in FIG. 2 can be achieved with two or more laser pulses LP1, LP2 or with a single laser pulse for the variant shown on the right side.

Hence, a transition from a "type I" modification (low power) to a "type II" modification (high power) can already be realized by a single pulse taking into account the power profile along the laser propagation direction.

In order to amplify this effect and to increase the difference between the two types of modification, a second pulse of increased power and with a changed focal length position can be used after a first uniform "type I" modification along the entire glass.

Figure 3:
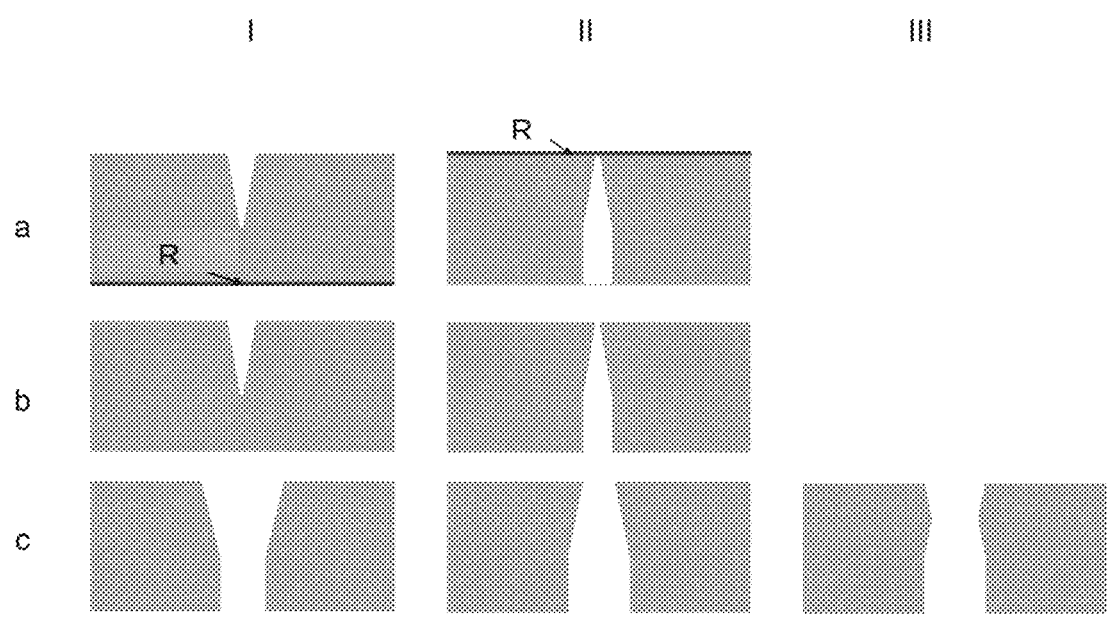
FIG. 3 shows different method steps when using an etching resist.

In a second process step shown in FIG. 3, one side of the glass substrate is covered with a hydrofluoric acid-resistant covering, for example an adhesive film as etching resist R, so that in the following etching step a, only one type of modification is etched. After the etching resist R has been removed in process step b, an etching step b is performed again, whereby a double-sided etching of the glass substrate is achieved. Variants I and II differ by the arrangement of the etching resist R, whereas no etching resist is used in variant III.

Since both types of modification are etched in hydrofluoric acid at different speeds, this results in the cone angles $\alpha$, $\beta$ which differ from one another, as shown in FIG. 1. By first pre-etching one side, it is possible to adjust a one-sided difference in hole diameter.

In a second etching step, the apertures 1 can be enlarged. Thus, arbitrarily different geometries can be realized in accordance with the schematic shown.

The following wet-chemical solutions were realized as etching media:
Hydrofluoric Acid:
  Concentration: 1-20%
  Temperature: 5-40° C.
  Second acid: H2SO4, HCL, H3PO4
Potassium Hydroxide Solution:
  Concentration: 10-60%
  Temperature: 85-160° C.

Unlike in the prior art, different cone angles $\alpha$, $\beta$ and hole diameters on either side of the glass substrate 2 can thus be adjusted. Individual geometries of the apertures 1 can thus be produced, ruling out in particular the microcracks caused by laser drilling which are unavoidable according to the prior art. In particular, the cone angle $\alpha$, $\beta$ of the apertures 1 can be variable in the cross section of the substrate material. This results, for example, in advantages for the production of components for microfluidics.

According to the invention, a plurality of modifications having different characteristics, for example continuous modification and chains of bubbles, can be generated along the beam axis s in the glass. As a result, the etching attack across the length of the modification becomes heterogeneous, i.e., in particular, the etching rate becomes different under constant etching conditions.

The following aspects can be advantageously implemented according to the invention:
  Change in etching conditions in different regions
  One-sided or double-sided etching (etching resist)
  Use as nozzle plate All holes identical, accuracy <3 μm
Opening angle <5°
Difference in opening angles >10°
Different modifications are achieved by means of phase modulation (spatial light modulator, SLM) or variation of the process parameters (focal position, intensity, etc.)

Processing is explained in more detail below with reference to the figure based on an example of a process sequence for creating two different cone angles α, β within an aperture with a cone angle α of approx. 15° in the upper region and a cone angle β of approx. 2° in the lower region.

First, laser structuring is carried out with two laser pulses with different pulse energies, producing modifications across the entire thickness of the glass substrate 2 and additionally of a chain of bubbles in the upper part of the glass substrate 2.

The glass substrate 2 is subsequently laminated on one side with hydrofluoric acid-resistant film and fixed in a holding frame. Thereafter, the side that is not protected by the film is etched in hydrofluoric acid (1 to 20% HF) for 5 to 60 minutes at a temperature between 5° C. and 30° C.

Afterwards, a region of the film which protects the area of the recess to be introduced is removed, for example irradiated with UV light in case of a film realized as a UV release tape or treated with heat in case of a film realized as a heat release tape. The film remains in the edge region of the recess to be introduced, thus improving the handling of the glass substrate 2. After the subsequent re-etching process, the film is completely removed.

Instead of the film, a chromium coating can, for example, also be applied, wherein the first etching bath is adjusted such that the coating is removed only in a subsequent etching bath.

A further laser modification, for example after a preceding etching treatment, as well as a one-sided or double-sided etching treatment can also be performed.

Very thin glass substrates 2 with a thickness of less than 100 μm are preferably fixed in wafer frames, for example adhesively bonded thereto, for better handling during processing While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for creating at least one recess, in particular an aperture, in a transparent or transmissive material, comprising:
selectively modifying the material along a beam axis by a beam of electromagnetic radiation; and
creating the at least one recess by one or more etching steps, using different etching rates in a modified region and in non-modified regions,
wherein the beam of electromagnetic radiation produces modifications in different regions along the beam axis having different characteristics in the material such that an etching process in the material is heterogeneous and etching rates in the different regions along the beam axis differ from one another under unchanged etching conditions,
wherein the different characteristics of the modifications are achieved by varying at least one parameter of the beam of electromagnetic radiation across the different regions along the beam axis, the at least one parameter comprising at least one of a pulse energy, a beam shape, or an intensity.

2. The method according to claim 1, wherein the different characteristics of the modifications are achieved by varying the beam shape of the beam of electromagnetic radiation across the different regions along the beam axis by phase modulation.

3. The method according to claim 1, wherein a cycle of modification and etching treatment of the material is performed several times.

4. The method according to claim 1, wherein the one or more etching steps comprise a plurality of etching steps with different etching conditions.

5. The method according to claim 1, wherein the material comprising a plate-shaped material, and
wherein a surface of the plate-shaped material is covered with an etching resist at least in sections and is thereby protected from the etching attack in one or more subsequent etching processes.

6. The method according to claim 1, wherein by selecting the at least one parameter of the beam of electromagnetic radiation, an opening angle is adjusted to less than 5° and/or a diameter of the recess is adjusted.

7. The method according to claim 1, wherein by varying the at least one parameter of the beam of electromagnetic radiation across the different regions along the beam axis, a difference between a first opening angle in a first region and a second opening angle in a second region due to the modifications having different characteristics is more than 10°.

8. The method according to claim 1, wherein the different characteristics of the modifications are achieved by using a plurality of electromagnetic radiation pulses having at least one different parameter.

9. The method according to claim 1, wherein the different characteristics of the modifications are achieved by using a single electromagnetic radiation pulse having a varying power profile along a laser propagation direction.

\* \* \* \* \*